(12) United States Patent
Wu

(10) Patent No.: US 8,171,368 B1
(45) Date of Patent: May 1, 2012

(54) PROBABILISTIC TRANSITION RULE FOR TWO-LEVEL DECODING OF REED-SOLOMON CODES

(75) Inventor: Yingquan Wu, Santa Clara, CA (US)

(73) Assignee: Link_A_Media Devices Corporation, Santa Clara, CA (US)

( * ) Notice: Subject to any disclaimer, the term of this patent is extended or adjusted under 35 U.S.C. 154(b) by 1062 days.

(21) Appl. No.: 12/069,728

(22) Filed: Feb. 11, 2008

Related U.S. Application Data

(60) Provisional application No. 60/901,957, filed on Feb. 16, 2007.

(51) Int. Cl.
*G06F 11/00* (2006.01)
(52) U.S. Cl. ........................................ 714/752; 714/784
(58) Field of Classification Search .................. 714/752, 714/781, 784
See application file for complete search history.

(56) References Cited

U.S. PATENT DOCUMENTS

| | | | |
|---|---|---|---|
| 4,397,022 A | 8/1983 | Weng et al. | |
| 5,537,429 A * | 7/1996 | Inoue ............................ | 714/755 |
| 5,715,258 A | 2/1998 | Ikeda et al. | |
| 6,092,233 A | 7/2000 | Yang | |
| 6,134,694 A | 10/2000 | Uebayashi et al. | |
| 6,360,348 B1 | 3/2002 | Yang | |
| 6,460,160 B1 | 10/2002 | Classon | |
| 6,487,691 B1 * | 11/2002 | Katayama et al. ............ | 714/784 |
| 6,516,443 B1 | 2/2003 | Zook | |
| 6,634,007 B1 * | 10/2003 | Koetter et al. ................ | 714/784 |
| 7,310,767 B2 | 12/2007 | Desai et al. | |
| 7,322,004 B1 * | 1/2008 | Yu et al. ......................... | 714/784 |
| 7,458,007 B2 * | 11/2008 | Sankaran et al. ............. | 714/782 |
| 7,562,282 B1 * | 7/2009 | Rothberg ....................... | 714/785 |
| 7,653,862 B2 * | 1/2010 | Hassner et al. ............... | 714/767 |
| 7,900,122 B2 * | 3/2011 | Shen et al. .................... | 714/784 |
| 7,984,366 B2 * | 7/2011 | Hsu ................................ | 714/784 |
| 2003/0093741 A1 | 5/2003 | Argon et al. | |
| 2003/0232601 A1 | 12/2003 | Uno | |
| 2004/0019842 A1 | 1/2004 | Argon et al. | |
| 2005/0166126 A1 * | 7/2005 | Muller et al. ................. | 714/784 |
| 2006/0020869 A1 * | 1/2006 | Desai et al. .................... | 714/752 |
| 2006/0059410 A1 | 3/2006 | Santraine et al. | |
| 2010/0174954 A1 * | 7/2010 | Karabed et al. ............... | 714/704 |
| 2010/0199149 A1 * | 8/2010 | Weingarten et al. .......... | 714/773 |

OTHER PUBLICATIONS

E. Berlekamp, "Bounded Distance + 1 Soft-Decision Reed-Solomon Decoding," IEEE Trans. on Inform. Theory, vol. 42, No. 3, pp. 704-720, May 1996.

D. Chase, "A class of algorithms for decoding block codes with channel measurement information," IEEE Trans. Inform. Theory, vol. 18, pp. 170-182, Jan. 1972.

R. Koetter, "Fast generalized minimum-distance decoding of algebraic-geometry and Reed-Solomon codes," IEEE Trans. Inform. Theory, vol. 42, pp. 721-737, May 1996.

(Continued)

*Primary Examiner* — Marc Duncan
(74) *Attorney, Agent, or Firm* — Van Pelt, Yi & James LLP

(57) ABSTRACT

Decoding data is disclosed, including computing a syndrome polynomial for Reed-Solomon encoded data, applying the Berlekamp-Massey method to solve key equations associated with the syndrome polynomial, comparing a linear feedback shift register (LSFR) length $L_A$ associated with an error locator polynomial $\Lambda(x)$ with an error correction capability t, and based on the comparison, determining whether to perform soft decision decoding or a Chien search.

19 Claims, 3 Drawing Sheets

OTHER PUBLICATIONS

G. D. Forney, "Generalized minimum distance decoding," IEEE Trans. Inform. Theory, vol. 12, pp. 125-131, Dec. 1966.

V. Guruswami and M. Sudan, "Improved decoding of Reed-Solomon codes and algebraic-geometry codes," IEEE Trans. Inform. Theory, vol. 45, No. 6, pp. 1757-1767, Sep. 1999.

J. Jiang and K. R. Narayanan, "Iterative soft-input-soft-output decoding of Reed-Solomon codes by adapting the parity check matrix," IEEE Trans. Inform. Theory, vol. 52, pp. 3746-3756, Aug. 2006.

R. Koetter and A. Vardy, "Algebraic soft-decision decoding of Reed-Solomon codes," IEEE Trans. Inform. Theory, vol. 49, No. 11, pp. 2809-2825, Nov. 2003.

G. David Forney, Jr., "On Decoding BCH Codes," IEEE Trans. on Inform. Theory, vol. IT-11, No. 4, pp. 549-557, Oct. 1965.

J. L. Massey, "Shift-Register Synthesis and BCH Decoding," IEEE Trans. Inform. Theory, vol. IT-15, No. 1, pp. 122-127, Jan. 1969.

U.S. Appl. No. 11/433,645, filed May 11, 2005, Yingquan Wu.

* cited by examiner

PROBABILISTIC TRANSITION RULE FOR TWO-LEVEL DECODING OF REED-SOLOMON CODES

CROSS REFERENCE TO OTHER APPLICATIONS

This application claims priority to U.S. Provisional Patent Application No. 60/901,957 entitled A PROBABILISTIC TRANSITION RULE FOR TWO-LEVEL DECODING OF REED-SOLOMON CODES filed Feb. 16, 2007 which is incorporated herein by reference for all purposes.

BACKGROUND OF THE INVENTION

Reed-Solomon codes are commonly used error correction codes. Their widespread applications include magnetic and optical data storage, wireline and wireless communications, and satellite communications. A Reed-Solomon code (n,k) over a finite field GF(q) satisfies n<q and achieves the maximally separable distance, i.e., d=n−k+1. The Berlekamp-Massey method efficiently decodes up to half minimum distance with complexity O(dn). The method can be clearly divided into three operation stages. The first stage performs syndrome computation, which takes n cycles. The second stage computes the error locator polynomial and the scratch polynomial, which takes d cycles. (In practice, the code rate is high and thus the minimum distance d is much smaller than the code length n.) The third stage performs Chien search and error evaluation, which costs n cycles. The total number of cycles is 2n+d. It would be desirable to reduce the latency of the whole decoding process while keeping both power consumption and decoding failure rate approximately the same. Such improvements would be particularly attractive for on-the-fly applications where a low latency is desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process, an apparatus, a system, a composition of matter, a computer readable medium such as a computer readable storage medium or a computer network wherein program instructions are sent over optical or communication links. In this specification, these implementations, or any other form that the invention may take, may be referred to as techniques. A component such as a processor or a memory described as being configured to perform a task includes both a general component that is temporarily configured to perform the task at a given time or a specific component that is manufactured to perform the task. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
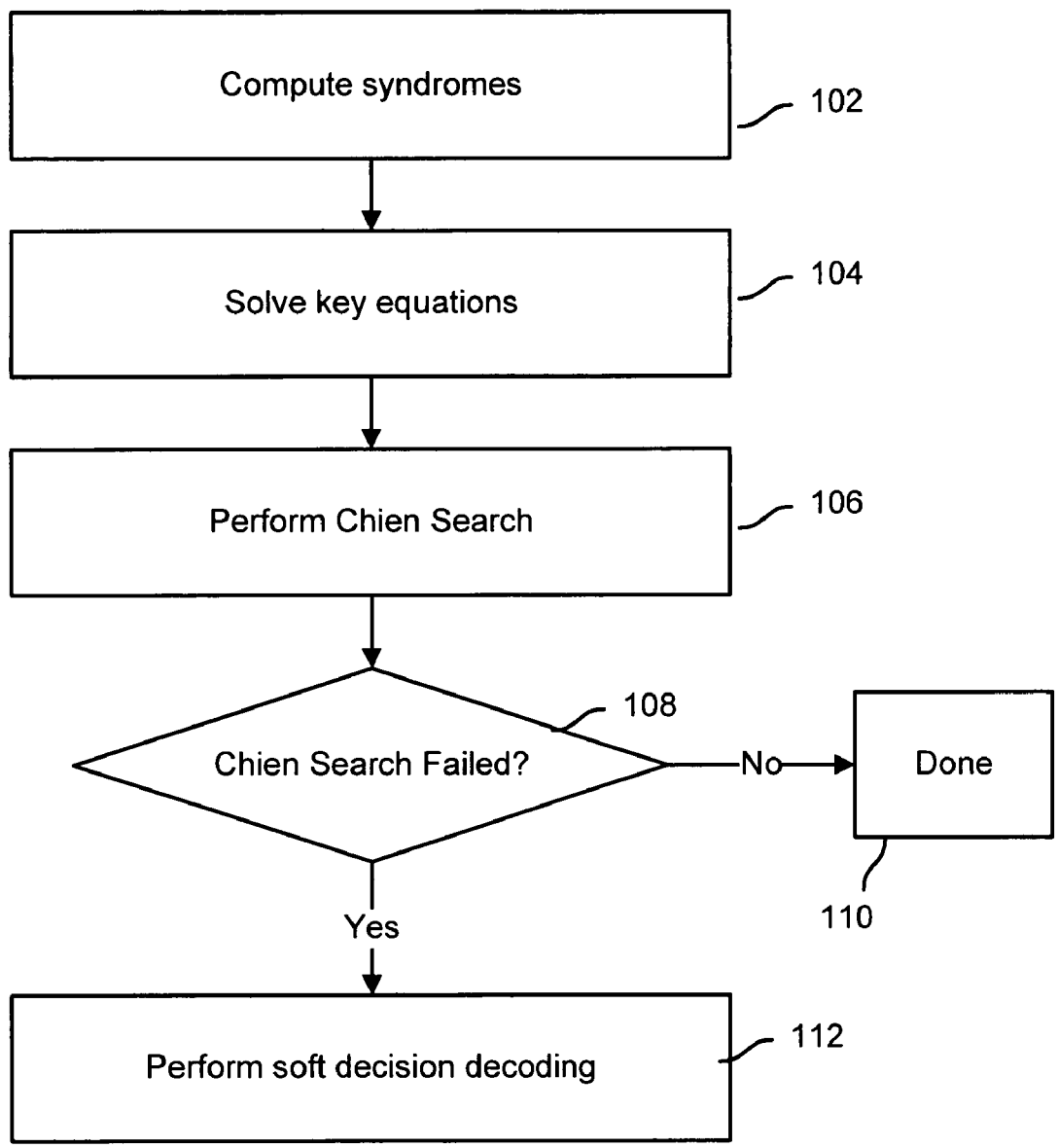
FIG. 1 is a flow chart illustrating an example of a process for performing conventional two-level decoding.

FIG. 1 is a flow chart illustrating an example of a process for performing conventional two-level decoding. In conventional two-level decoding, soft-decision decoding is performed only if hard-decision decoding fails.

Power and latency are two of the most important factors in on-the-fly applications, such as next generation data storage. In order to save power, conventionally, soft-decision decoding is performed only after hard-decision decoding is known to have failed, which typically means that if the Chien search fails, soft-decision decoding is performed, as shown in the example flowchart of FIG. 1. At 102, syndromes are computed.

Given Reed-Solomon C(n,k) code over GF(q), a codeword polynomial C(x) satisfies $C(\alpha^{m_0+i})=0, i=0,1,2,\ldots,n-k-1.$ The minimum Hamming distance of the code is d=n−k+1, a feature known as maximally-distance separable. The error correction capability is defined as $$t \triangleq \left\lfloor \frac{d-1}{2} \right\rfloor = \left\lfloor \frac{n-k}{2} \right\rfloor.$$

The hard-decision Berlekamp-Massey method is introduced next, which is the foundation of the two-level decoding regime.

Let C(x) denote the transmitted codeword polynomial and R(x) the received word polynomial after appropriate channel quantization. The decoding objective is to determine the error polynomial E(x) such that C(x)=R(x)−E(x).

The first step is computing syndrome values $S_i = R(\alpha^{i+1}) = C(\alpha^{i+1}) + E(\alpha^{i+1}) = E(\alpha^{i+1}),$
$i=0,1,2,\ldots,n-k-1.$ Define the syndrome polynomial $$S(x) = S_0 + S_1 x + S_2 x^2 + \ldots + S_{n-k-1} x^{n-k-1}. \tag{1}$$

Define the error locator polynomial $$\Lambda(x) \triangleq \prod_{i=1}^{e}(1 - X_i x) = 1 + \Lambda_1 x + \Lambda_2 x^2 + \ldots + \Lambda_e x^e. \tag{2}$$

Define the error evaluator polynomial $$\Omega(x) \triangleq \prod_{i=1}^{e} Y_i X_i \prod_{j=1, j \neq i}^{e}(1 - X_j x) = \tag{3}$$

$$\Omega_0 + \Omega_1 x + \Omega_2 x^2 + \ldots + \Omega_{e-1} x^{e-1}.$$

The three polynomials satisfy the following key equation $$\Omega(x) = \Lambda(x) S(x) \pmod{x^{n-k}}. \tag{4}$$

Returning to FIG. 1, at 104, key equations are solved. In some embodiments, the key equations are solved using the Berlekamp-Massey method.

Pseudo code of the Berlekamp-Massey Method is given below:

Berlekamp-Massey Method
Input: $S = [S_0, S_1, S_2, \ldots, S_{n-k-1}]$
Initialization: $\Lambda^{(0)}(x) = 1$, $B^{(0)}(x) = 1$, and $L = 0$
For $r = 0, 1, 2, \ldots, n-k-1$, do:
    Compute $\Delta_{r+1} = \Sigma_{i=0}^{L} \Lambda_i^{(r)} \cdot S_{r-i}$
    Compute $\Lambda^{(r+1)}(x) = \Lambda^{(r)}(x) - \Delta_{r+1} \cdot x B^{(r)}(x)$
    If $\Delta_{r+1} \neq 0$ and $2L \leq r$, then
        Set $B^{(r+1)}(x) \leftarrow \Delta_{r+1}^{-1} \Lambda^{(r)}(x)$ and $L \leftarrow r+1-L$
    Else
        Set $B^{(r+1)}(x) \leftarrow x B^{(r)}(x)$
    endif
endfor
Output: $\Lambda(x)$ and $B(x)$.

Note that in the above description, superscript "(r)" is used to stand for the r-th iteration and subscript "i" the i-th coefficient.

At 106, a Chien search is performed. With a given $\Lambda(x)$ and $B(x)$, the final stage is to perform the Chien search to identify all qualified roots and apply the Koetter-Horiguchi formula to determine the corresponding error magnitudes.

At 108, it is determined if the Chien search failed. The decoding is declared as a failure when the Chien search fails to find the same number of qualified roots as its degree.

If the Chien search did not fail, the process is done at 110. If the Chien search failed, soft decision decoding is performed at 112.

The Berlekamp-Massey method can be pipelined in three stages. The syndrome computation takes n cycles. The key-equation solver (i.e., the core of the Berlekamp-Massey method) takes d cycles (In practice, the code rate is high and thus the minimum distance d is much smaller than the code length n). Finally, the Chien search and error evaluation takes n cycles.

When soft-decision decoding is considered, it is conventional practice to perform two-level decoding, performing soft-decision decoding only if the hard-decision decoding fails. Since hard-decision decoding rarely fails, the extra power consumption due to switching to soft-decision decoding is negligible.

Moreover, the hard-decision decoding has much shorter latency than that of soft-decision decoding. Thus, the two-level decoding scheme effectively solves the issue of average long latency in some cases. However, for on-the-fly applications, it would be desirable to reduce the latency of the whole decoding process for all cases while compromising negligibly in power consumption and decoding failure rate.

Disclosed herein is a probabilistic transition rule such that soft-decision decoding is performed when the Berlekamp-Massey method fails at a preset rate that is significantly below the failure rate of the soft-decision decoding. The probabilistic transition rule allows soft-decision decoding to begin right after computing the error locator polynomial in the second stage while negligibly affecting power and performance.

Figure 2:
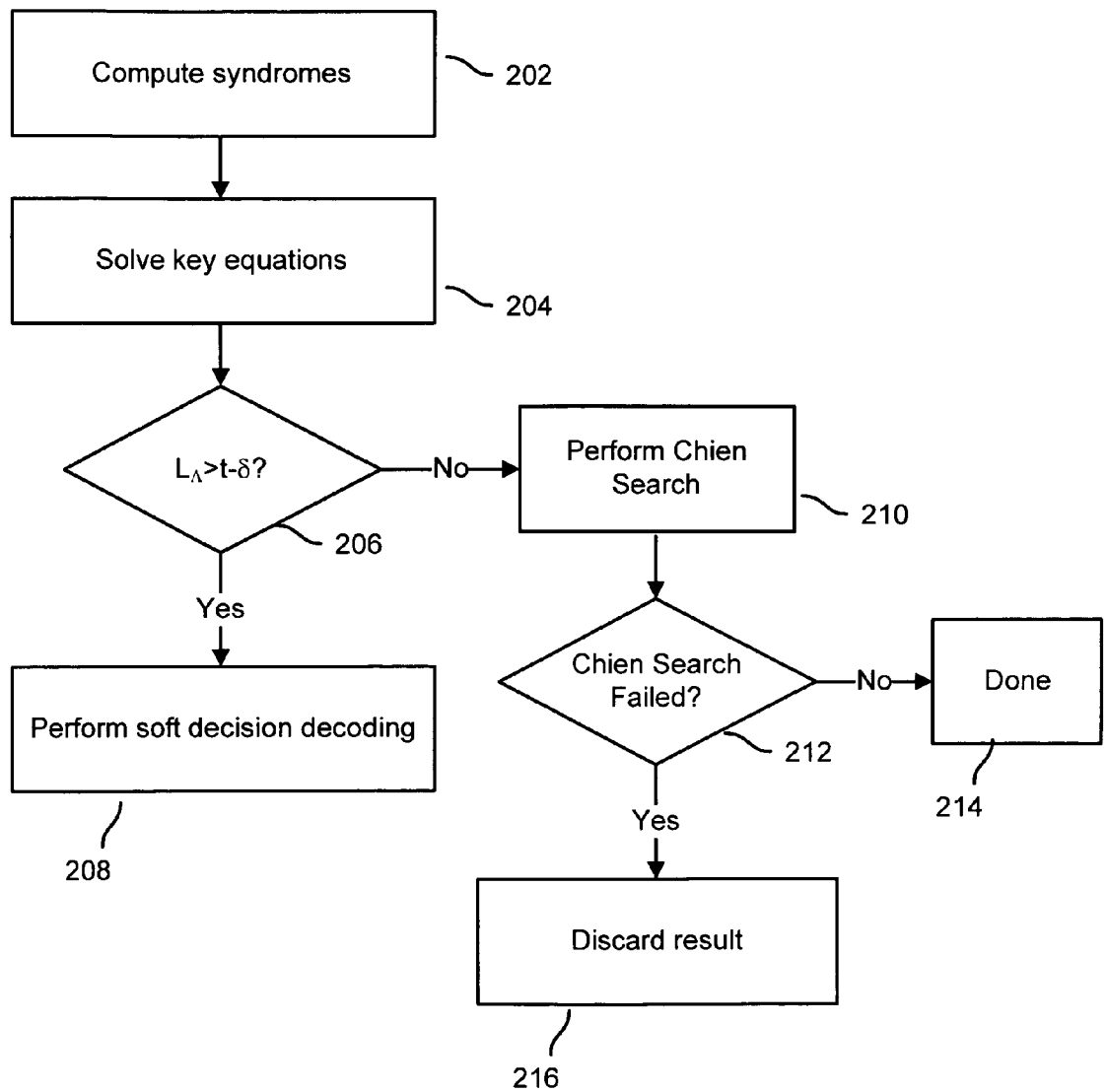
FIG. 2 is a flow chart illustrating an embodiment of a process for performing two-level decoding using a probabilistic transition rule.

FIG. 2 is a flow chart illustrating an embodiment of a process for performing two-level decoding using a probabilistic transition rule. In this case, a probabilistic transition rule is used to switch to soft-decision decoding without going through the Chien search compared to the conventional scheme where soft-decision decoding is started when the Berlekamp-Massey method fails absolutely, which can only be determined after the Chien search.

The following proposition characterizes an insight of the Berlekamp-Massey method.

Proposition 1 (i). If the degree of $\Lambda(x)$, $L_\Lambda \leq t$, then, the discrepancies satisfy $$\Delta_r = 0, \quad r = 2L_\Lambda + 1, 2L_\Lambda + 2, \ldots, n-k. \tag{5}$$

(ii). If $L_\Lambda \leq t$, then either $\Lambda(x)$ is the genuine error locator polynomial corresponding to $L_\Lambda$ errors, or there are more than $n - k - L_\Lambda$ errors.

When it is not decodable (i.e., there are more than t errors), then it is plausible to assume that the possibility of $\Delta_r = 0$, $r = 2L_\Lambda + 1, 2L_\Lambda + 2, \ldots, n-k$, is roughly $q^{-(n-k-2L)}$, where q is the field size, following the fact that the value of $\Delta_r$ is very much random within $GF(q)$. It is also assumed that the soft-decision decoding reduces the failure rate by a factor of $f_s$ on top of the hard-decision decoding. Following these two assumptions, the following probabilistic transition for two-level decoding is obtained:

If $L_\Lambda > t - \delta$, then switch to soft-decision decoding, where $\delta$ satisfies $$q^{-(n-k-2t+2\delta)} << f_s, \tag{6}$$

otherwise, perform the Chien search and error correction, and terminate the decoding thereafter.

where
$L_\Lambda$ denotes the length of a linear feedback shift register (LFSR) of $\Lambda(x)$
t is the error correction capability
$\delta$ is tolerance limit
q is the finite field or Galois field size The performance degradation due to the cases where more than t errors occur at the same time $L_\Lambda \leq t - \delta$ is negligible. On the other hand, in practical applications, $\delta << t$, therefore, the extra power consumption due to switching to soft-decision decoding when $t - \delta < L_\Lambda$ t is also negligible.

In such embodiments, the decision of whether to perform the second level or soft decision decoding is based on the length of the register.

In the embodiment of FIG. 2, two-level decoding using the proposed probabilistic transition rule is performed as follows. At 202, syndromes are calculated. For example, syndromes are calculated as at 102. At 204, key equations are solved. For example, key equations are solved as at 104. At 206, a probabilistic transition rule is checked. In the embodiment shown, checking includes determining whether $L_\Lambda > t - \delta$. If $L_\Lambda > t - \delta$, then soft decision decoding is performed at 208. In this example, a Chien search is not performed if soft decision decoding is performed at 208. In this case, the likelihood that soft decision decoding will succeed is larger than the likelihood that hard decoding (Chien search) will succeed. If $L_\Lambda \leq t - \delta$, then the Chien search is performed at 210. In this case, the likelihood that the Chien search will succeed is higher than the likelihood that soft decision decoding will succeed. At 212, it is determined whether the Chien search fails. If the Chien search does not fail, then the process is done at 214. If the Chien search does fail, the result is discarded at 216. In other embodiments, if the Chien search fails, the process could proceed to 208 and soft decision decoding could be performed.

Figure 3:
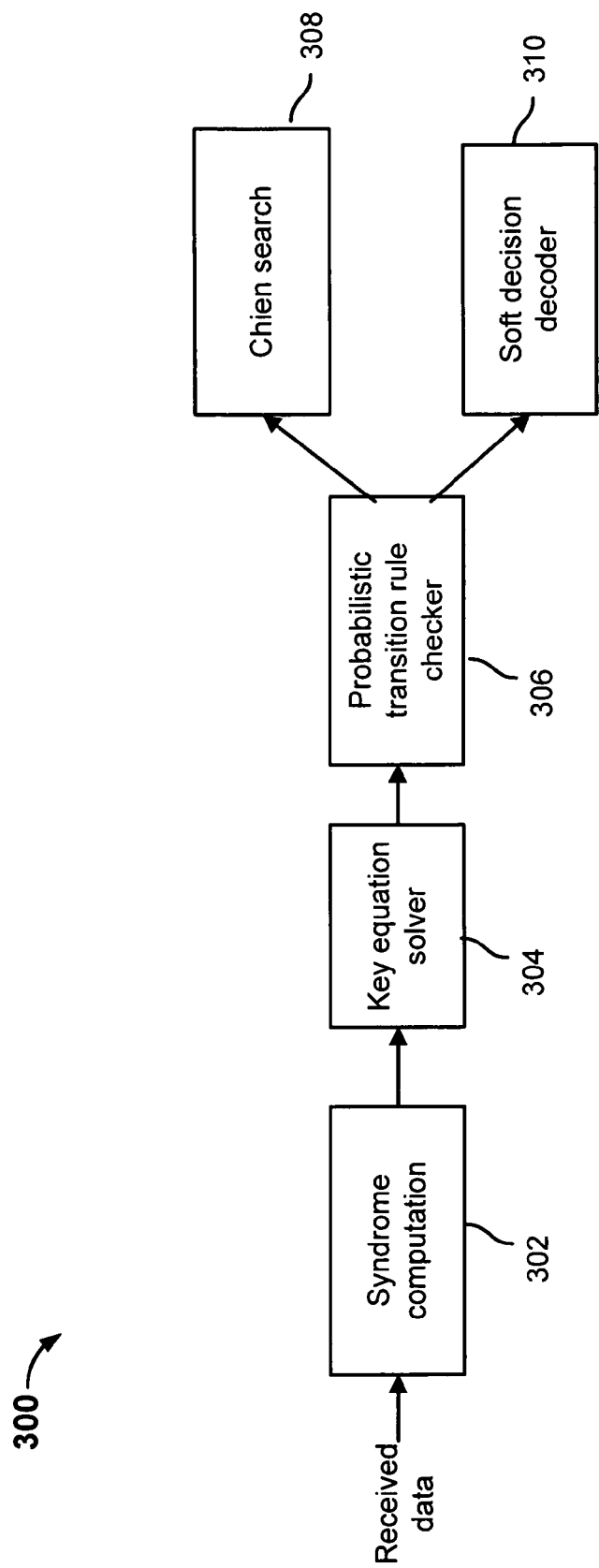
FIG. 3 is a block diagram illustrating an embodiment of a system for performing two-level decoding utilizing the proposed probabilistic transition rule.

FIG. 3 is a block diagram illustrating an embodiment of a system for performing two-level decoding utilizing the proposed probabilistic transition rule. For example, system 300 may be used to perform the process of FIG. 2. In the example shown, encoded data is received at syndrome computation block 302. Syndromes are provided as input to key equation solver 304 which, for example, performs the Berlekamp-Massey method. Probabilistic transition rule checker 306 receives Λ(x) and B(x), and determines whether to perform the Chien search or soft decision decoding. Depending on the decision, various control signal values are passed from the probabilistic transition rule checker 306 to Chien search block 308 and soft decision decoding block 310 to turn on one or the other. In some embodiments, block 302 performs step 202, block 304 performs step 204, block step 306 performs 206, block 308 performs step 210, and block 310 performs step 208.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method of decoding data, comprising:
   receiving Reed-Solomon encoded data at an input;
   computing a syndrome polynomial for the Reed-Solomon encoded data, wherein computing is performed by a processor;
   applying the Berlekamp-Massey method to solve key equations associated with the syndrome polynomial;
   comparing a linear feedback shift register (LFSR) length $L_A$ with an error correction capability t, wherein the LFSR is associated with an error locator polynomial Λ(x); and
   based on the comparison, determining whether to perform soft decision decoding or a Chien search;
   in the event that the LFSR length $L_A$ is greater than a metric, performing soft decision decoding on the Reed-Solomon encoded data to produce decoded data; and
   providing the decoded data as output.

2. A method as recited in claim 1, wherein the metric is a difference between the error correction capability t and a tolerance δ.

3. A method as recited in claim 2, further including in the event that the LFSR length $L_A$ is less than the metric, performing a Chien search.

4. A method as recited in claim 1, further including in the event that the LFSR length $L_A$ is less than a difference between the error correction capability t and a tolerance δ, performing a Chien search.

5. A method as recited in claim 1, wherein comparing and determining are performed before performing a Chien search.

6. A method as recited in claim 1, wherein in the event soft decision decoding is performed, the Chien search is not performed.

7. A method as recited in claim 1, wherein in the event the Chien search is performed and the Chien search fails, a result is discarded.

8. A system for decoding data, comprising:
   a processor configured to:
   compute a syndrome polynomial for Reed-Solomon encoded data;
   apply the Berlekamp-Massey method to solve key equations associated with the syndrome polynomial;
   compare a linear feedback shift register (LFSR) length $L_A$ with an error correction capability t, wherein the LFSR is associated with an error locator polynomial Λ(x); and
   based on the comparison, determine whether to perform soft decision decoding or a Chien search;
   a memory coupled with the processor, wherein the memory is configured to provide the processor with instructions.

9. A system as recited in claim 8, wherein the processor is further configured to, in the event that the LFSR length $L_A$ is greater than a difference between the error correction capability t and a tolerance δ, perform soft decision decoding.

10. A system as recited in claim 8, wherein the processor is further configured to, in the event that the LFSR length $L_A$ is less than a difference between the error correction capability t and a tolerance δ, perform a Chien search.

11. A system as recited in claim 8, wherein comparing and determining are performed before performing a Chien search.

12. A system as recited in claim 8, wherein in the event soft decision decoding is performed, the Chien search is not performed.

13. A system as recited in claim 8, wherein in the event the Chien search is performed and the Chien search fails, a result is discarded.

14. A computer program product for decoding data, the computer program product being embodied in a non-transitory computer readable medium and comprising computer instructions for:
   computing a syndrome polynomial for Reed-Solomon encoded data;
   applying the Berlekamp-Massey method to solve key equations associated with the syndrome polynomial;
   comparing a linear feedback shift register (LFSR) length $L_A$ with an error correction capability t, wherein the LFSR is associated with an error locator polynomial Λ(x); and
   based on the comparison, determining whether to perform soft decision decoding or a Chien search.

15. A computer program product as recited in claim 14, further comprising computer instructions for, in the event that the LFSR length $L_A$ is greater than a difference between the error correction capability t and a tolerance δ, performing soft decision decoding.

16. A computer program product as recited in claim 14, further comprising computer instructions for, in the event that the LFSR length $L_A$ is less than a difference between the error correction capability t and a tolerance δ, performing a Chien search.

17. A computer program product as recited in claim 14, wherein comparing and determining are performed before performing a Chien search.

18. A computer program product as recited in claim 14, wherein in the event soft decision decoding is performed, the Chien search is not performed.

19. A computer program product as recited in claim 14, wherein in the event the Chien search is performed and the Chien search fails, a result is discarded.

* * * * *